US011355692B2

United States Patent
Sun et al.

(10) Patent No.: US 11,355,692 B2
(45) Date of Patent: Jun. 7, 2022

(54) NANOSCALE RADIO FREQUENCY MAGNETOELECTRIC ANTENNA

(71) Applicant: Northeastern University, Boston, MA (US)

(72) Inventors: Nian Xiang Sun, Winchester, MA (US); Hwaider Lin, Quincy, MA (US); Tianxiang Nan, Watertown, MA (US)

(73) Assignee: Northeastern University, Boston, MA (US)

( * ) Notice: Subject to any disclaimer, the term of this patent is extended or adjusted under 35 U.S.C. 154(b) by 760 days.

(21) Appl. No.: 16/304,802

(22) PCT Filed: May 31, 2017

(86) PCT No.: PCT/US2017/035332
§ 371 (c)(1),
(2) Date: Nov. 27, 2018

(87) PCT Pub. No.: WO2017/210373
PCT Pub. Date: Dec. 7, 2017

(65) Prior Publication Data
US 2020/0321512 A1    Oct. 8, 2020

Related U.S. Application Data

(60) Provisional application No. 62/343,801, filed on May 31, 2016.

(51) Int. Cl.
*H01L 41/08* (2006.01)
*H01L 41/18* (2006.01)
*H01Q 1/36* (2006.01)

(52) U.S. Cl.
CPC .............. *H01L 41/08* (2013.01); *H01L 41/18* (2013.01); *H01Q 1/364* (2013.01)

(58) Field of Classification Search
CPC .......... H01L 41/08; H01L 41/18; H01Q 1/364
See application file for complete search history.

(56) References Cited

U.S. PATENT DOCUMENTS 8,803,751 B1    8/2014  Miller et al.
9,817,088 B2 *  11/2017  Naik .................... G01R 33/098
(Continued)

FOREIGN PATENT DOCUMENTS

CN       108879071 A  * 11/2018
CN       215342978 U  * 12/2021
WO    WO-2020176382 A1 *  9/2020  ........... H01Q 21/061

OTHER PUBLICATIONS

Gao et al., "High quality factor integrated gigahertz transformers with FeGaB/Al2O3 multilayer films for radio frequency integrated circuits applications", Journal of Applied Physics 115,17E714 (2014), 3 pages.
(Continued)

*Primary Examiner* — J. San Martin
(74) *Attorney, Agent, or Firm* — Verrill Dana, LLP

(57) ABSTRACT

A nanomechanical magnetoelectric antenna includes a thin film heterostructure that has a magnetic element and a piezoelectric element. The heterostructure is suspended on a substrate and is capable of resonating at acoustic resonance frequencies. In the transmission mode of the antenna, oscillating mechanical strain produced by voltage-induced acoustic waves is transferred to the thin film heterostructure through strain mediated magnetoelectric coupling. This gives rise to magnetization oscillation or magnetic current that radiates electromagnetic waves at the acoustic resonance frequencies. In the receiving mode, the heterostructure senses magnetic components of electromagnetic waves arriving at the antenna, converting these into a piezoelectric voltage output.

23 Claims, 6 Drawing Sheets

(56) References Cited

U.S. PATENT DOCUMENTS

| | | | |
|---|---|---|---|
| 10,364,511 B1* | 7/2019 | Chen | H01Q 1/00 |
| 2004/0027033 A1 | 2/2004 | Schiller | |
| 2015/0086765 A1* | 3/2015 | Garg | H01L 41/318 |
| | | | 428/216 |
| 2016/0003924 A1* | 1/2016 | Sun | G01R 33/28 |
| | | | 324/322 |
| 2019/0267534 A1* | 8/2019 | Sun | H01L 41/18 |
| 2020/0144480 A1* | 5/2020 | Sun | A61B 5/245 |

OTHER PUBLICATIONS

Hui et al., "MEMS resonant magnetic field sensor based on an AIN/FeGaB bilayer nano-plate resonator", Proceedings of the IEEE International Conference on Micro Electro Mechanical Systems (MEMS) 5 pages, doi: 10.1109/MEMSYS.2013.6474344 (2013).

V. Robisch et al., "Exchange biased magnetoelectric composites for magnetic field sensor application by frequency conversion", Journal of Applied Physics 117, 17B513 (2015); https://doi.org/10.1063/1.4913814 (abstract only).

Das et al., "Electric-Field-Tunable Low Loss Multiferroic Ferrimagnetic-Ferroelectric Heterostructures", Adv. Mater. 21, pp. 1-5 (2009).

Sun et al., "Voltage Control of Magnetism in Multiferroic Heterostructures and Devices", Spin vol. 2, No. 3, 1240004 (2012) 46 pages.

Hui et al., "Plasmonic piezoelectric nanomechanical resonator for spectrally selective infrared sensing", Nat. Commun. 7, 11249 (2016), 9 pages.

Qian et al., "Graphene as a Massless Electrode for Ultrahigh-Frequency Piezoelectric Nanoelectromechanical Systems", Nano Letters, (2015). doi:10.1021/acs.nanolett.5b01208, pp. 4599-4604.

Dong et al., "Push-pull mode magnetostrictive/piezoelectric laminate composite with an enhanced magnetoelectric voltage coefficient", Appl. Phys. Lett. 87, 1-4 (2005).

Lou et al., "Soft magnetism, magnetostriction, and microwave properties of FeGaB thin films", Appl. Phys. Lett. 91, 4 pages, (2007).

Piazza et al., "Piezoelectric Aluminum Nitride Vibrating Contour-mode MEMS resonator", Microelectromechanical Syst. J. 15, 1406-1418 (2006).

Rinaldi et al., Super-High-Frequency Two-Port AIN Contour—Mode Resonators for RF Applications, IEEE Trans. Ultrason. Ferroelectr. Freq. Control, vol. 57, No. 1, 38-45 (2010).

Zuniga et al., "Nanoenabled microelectromechanical sensor for volatile organic chemical detection" Appl. Phys. Lett. 94, (2009), 5 pages.

Greve et al., Low damping resonant magnetoelectric sensors, Appl. Phys. Lett. 97, 1-3 (2010).

Greve et al., "Giant magnetoelectric coefficients in (Fe90Co10)78Si12B10-AIN thin film composites", Appl. Phys. Lett. 96, 182501 (2010), 4 pages.

Jahns et al., "Giant magnetoelectric effect in thin-film composites", J. Am. Ceram. Soc. 96, 1673-1681 (2013).

Nan et al., "Multiferroic magnetoelectric composites: Historical perspective, status, and future directions", J. Appl. Phys. 103, 1-35 (2008).

Lou et al., "Equivalence of direct and converse magnetoelectric coefficients in strain-coupled two-phase systems", Appl. Phys. Lett. 100, 1-3 (2012).

Glow, H "Very Low Coercive Force in Nickel-iron Films", (1962), Nature, vol. 194, pp. 1035-1036.

Israel et al., "A one-cent room-temperature magnetoelectric sensor", Nature Materials vol. 7, 93-94 (2008).

Wu et al., "Non-reciprocal tunable low-loss bandpass filters with ultra-wideband isolation based on magnetostatic surface wave", Microw. Theory Tech. IEEE Trans. vol. 60, No. 12, 3959-3968 (2012).

Chui et al., "Theoretical investigation on the possibility of preparing left-handed materials in metallic magnetic granular composites", Phys. Rev. B, vol. 65, 17 pages (2002).

Chu, L. J., "Physical Limitations of Omni-Directional Antennas", Mass. Institute of Technology, Technical Report No. 64, (1948), 24 pages.

Karnaushenko et al., "Compact helical antenna for smart implant applications", NPG Asia Mater. 7, e188 (2015), 10 pages.

Chen et al., "Microstripfed circularly polarized square-ring patch antenna for GPS applications," IEEE Trans. Antennas Propag., vol. 57, No. 4, pp. 1264 1267, Apr. 2009.

Fetisov et al., Electric field tuning characteristics of a ferrite-piezoelectric microwave resonator. Appl. Phys. Lett. 88, 4 pages (2006).

Srinivasan et al., Ferrite-Piezoelectric Layered Structures: Microwave Magnetoelectric Effects and Electric Field Tunable Devices. Ferroelectrics 342, 65-71 (2006).

Fiebig, M. Revival of the magnetoelectric effect. J. Phys. D. Appl. Phys. 38, R123-R152 (2005).

Kummer et al., "Antenna measurements-1978" in IEEE Proc. 66, 483-507 (1978).

Lin et al., "Integrated non-reciprocal dual H-and E-Field tunable bandpass filter with ultra-wideband isolation", in Microw. Symp. (IMS), 2015 IEEE MTT-S Int. 1-4 (2015).

Lou et al., "Giant electric field tuning of magnetism in novel multiferroic FeGaB/Lead zinc niobate-lead titanate (PZN-PT) heterostructures", Adv. Mater. 21, 4711-4715 (2009).

Srinivasan et al., "Resonant magnetoelectric coupling in trilayers of ferromagnetic alloys and piezoelectric lead zirconate titanate: The influence of bias magnetic field", Phys. Rev. B—Condens. Matter Mater. Phys. 71, 1-6 (2005).

Hosseini et al., "Short and Open Circuited EBG Resonator Antennas: Miniaturization With a Shorting Plate and Dielectric Loading," IEEE Trans. Antennas Propag., vol. 63, No. 10, pp. 4305-4314, Oct. 2015.

Pintos et al., "Ultraminiature UHF antenna using magneto-dielectric material", 14th International Symposium on Antenna Technology and Applied Electromagnetics and AMEREM Conference, 2010, 4 pages.

Marauska et al., "Highly sensitive wafer-level packaged MEMS magnetic field sensor based on magnetoelectric composites", Sensors and Actuators A 189 (2013) pp. 321-327.

Nan, C. W., "Magnetoelectric effect in composites of piezoelectric and piezomagnetic phases", Phys. Rev. B 50, 6082-6088 (1994).

Liu et al., "Miniature platform tolerant antenna composed of microstrip line and AMC surface", Electronics Letters, Oct. 28, 2010, vol. 46, No. 22, 2 pages.

* cited by examiner

NANOSCALE RADIO FREQUENCY MAGNETOELECTRIC ANTENNA

CROSS-REFERENCE TO RELATED APPLICATIONS

This application claims the priority of U.S. Provisional Application No. 62/343,801, filed May 31, 2017 and entitled "Ultra-Compact RF Magnetoelectric Antennas Based on Acoustic Resonance in NMS Resonators", which is hereby incorporated by reference in its entirety.

BACKGROUND

Antennas that interconvert between electric power and electromagnetic wave radiation act as omnipresent critical components in communication systems including radars, satellites, smart phones, and wireless devices[1,2]. State of the art compact antennas rely on electromagnetic wave resonance and as such the sizes of these antennas are comparable to the electromagnetic wavelength $\lambda_0$. Typically, these antennas have a size of more than $\lambda_0/10$, i.e. 1/10 of the EM wavelength $\lambda_0$. This limitation on antenna size has made it challenging to achieve compact electric field sensors and sensor arrays, particularly at very high frequency (VHF; 30~300 MHz) or ultra-high frequency (UHF; 0.3~3 GHz), thus putting severe constraints on radars and other wireless communication systems on small mobile platforms[3].

Strong magnetoelectric (ME) coupling, resulting from strong interactions between the electric and magnetic orders, has been achieved in magnetoelectric heterostructures. This has made it possible to develop novel magnetoelectric device components that operate at room temperatures, such as spintronics-based components[4-6], low-frequency magnetic sensors[7-10], and reconfigurable RF components[11-14].

However, antenna miniaturization remains challenging. New antennas based on novel radiation and reception mechanisms are needed to drastically reduce the antenna size for portable electronic applications.

SUMMARY OF THE INVENTION

The present invention provides nanomechanical magnetoelectric antennas having a suspended ferromagnetic/ferroelectric thin film heterostructure that resonates at acoustic resonance frequencies. Voltage induced acoustic waves induce magnetization dynamics in the thin film heterostructure through magnetoelectric coupling, leading to radiation of electromagnetic waves at the acoustic resonance frequencies. Vice versa, the magnetoelectric antennas sense the magnetic components of electromagnetic waves, leading to a piezoelectric voltage output. These magnetoelectric antennas have dimensions comparable to their acoustic wavelength making it possible to produce antennas having sizes that are 1 to 2 orders of magnitude reduced compared to those of the state of the art compact antennas. Finite element simulations confirm results obtained from these antennas. These ultra-miniaturized magnetoelectric antennas have potential applications in the construction of magnetic nano-antennas for internet of things (IoT), mobile phones and other portable wireless communication systems.

In one aspect the invention provides a nanomechanical magnetoelectric (NME) antenna. The NME antenna includes a thin film heterostructure having a magnetic element and a piezoelectric element. The heterostructure is (i) suspended on a substrate and (ii) capable of resonating at acoustic resonance frequencies. The heterostructure is such that in transmission mode, oscillating mechanical strain produced by voltage induced acoustic waves is transferred to it through strain mediated magnetoelectric coupling, leading to magnetization oscillation (or magnetic current) that radiate electromagnetic waves at the acoustic resonance frequencies. In receiving mode, the heterostructure senses magnetic components of electromagnetic waves arriving at the antenna, converting the magnetic components into a piezoelectric voltage output.

Embodiments of the NME antenna can include one or more of the following features.

In one embodiment, the mode of vibration excited in the piezoelectric layer by the magnetic field and the electric field are the same.

In one embodiment, the substrate is a high resistivity silica wafer. In some embodiments, the magnetic element includes a FeGaB/AlO$_x$ multilayer made of alternating layers of an alloy of Fe, Ga, and B (FeGaB) and AlO$_x$.

In various embodiments, the piezoelectric layer includes at least one piezoelectric material selected from the group consisting of: aluminum nitride, lithium niobate, lithium tantalate, zinc oxide, gallium nitride, and quartz.

In one embodiment, the piezoelectric element is a thin film made of aluminum nitride (AlN). The thickness of the AlN thin film can be between 350 nm and 650 nm. In one embodiment, the thin film is about 500 nm thick.

The thickness of the FeGaB/AlO$_x$ multilayer can be between 350 and 650 nm. In one embodiment, the FeGaB/AlO$_x$ multilayer is about 500 nm thick.

In some embodiments, the frequency of the radiated electromagnetic waves ranges from 10 MHz to 10 GHz. In one embodiment, the frequency is between 60 MHz and 2.5 GHz.

In one embodiment, the thin film heterostructure is rectangular.

In certain embodiments, the heterostructure exhibits an in-plane contour mode of vibration ($d_{31}$ mode).

In various embodiments, the length and the width of the thin film heterostructure ranges from 100 μm to 400 μm and from 25 μm to 100 μm, respectively. For example, the length ranges from 150 μm to 300 μm and the width ranges from 35 μm to 75 μm. In one embodiment, the length is the length is 200 μm and the width is 50 μm.

In one embodiment, the ME coupling constant of the antenna is between 4 kV Oe$^{-1}$ cm$^{-1}$ to 8 kV Oe$^{-1}$ cm$^{-1}$ is in the absence of a DC bias magnetic field. For example, the ME coupling constant is about 6 kV Oe$^{-1}$ cm$^{-1}$.

In certain embodiments, the thin film heterostructure is circular. In various embodiments, the diameter of the thin film heterostructure lies between ranging 100 μm to 400 μm. In some embodiments the diameter lies between 150 μm to 250 μm. In one embodiment, the diameter is 200 μm.

In another aspect the invention provides a nanomechanical magnetoelectric antenna array. The array comprises a plurality of thin film heterostructures suspended on a substrate. Each of the plurality of heterostructures (i) includes a magnetic element and a piezoelectric element, (ii) is rectangular or circular in shape; and (iii) is capable of resonating at acoustic resonance frequencies. Further, in transmission mode, oscillating mechanical strain produced by voltage induced acoustic waves is transferred to each of the plurality of heterostructures through strain mediated magnetoelectric coupling, leading to magnetization oscillation (or magnetic current) that radiate electromagnetic waves at the acoustic resonance frequencies ranging from 10 MHz and 10 GHz. In receiving mode, each of the plurality of heterostructures senses magnetic components of electromagnetic waves arriving at the antenna, converting the magnetic components into a piezoelectric voltage output.

In some embodiments, the substrate of the array is a high resistivity silica wafer.

In one embodiment, the magnetic element of each of the heterostructures includes a FeGaB/AlO$_x$ multilayer made of alternating layers of an alloy of Fe, Ga, and B (FeGaB) and AlO$_x$.

In various embodiments, the piezoelectric element of each of the heterostructures includes at least one piezoelectric material selected from the group consisting of: aluminum nitride, lithium niobate, lithium tantalate, zinc oxide, gallium nitride, and quartz.

In one embodiment, the piezoelectric element is a thin film made of aluminum nitride (AlN). The thickness of the AlN thin film can be between 350 nm and 650 nm. For example, the AlN thin film is about 500 nm thick.

In various embodiments, the thickness of the FeGaB/AlO$_x$ multilayer is between 350 nm and 650 nm. In one embodiment, the FeGaB/AlO$_x$ multilayer is about 500 nm thick.

As used herein "AlO$_x$" means aluminum oxide ($Al_2O_3$).

In a further aspect, the invention provides a method of fabricating a nanomechanical magnetoelectric antenna device. The method includes the steps of: (a) providing a high resistivity substrate and depositing a film of a first electrode material on the substrate, partially covering the substrate; (b) depositing a film of piezoelectric material covering the first electrode material and the substrate; (c) etching a first via in the piezoelectric material thereby exposing the substrate, wherein the via is located at one extremity of the first electrode material film; (d) etching a second via in the piezoelectric material film at a location of the substrate not covered by the first electrode material film; (e) depositing a film of gold on the piezoelectric material film and patterning to form a top ground; (f) depositing a film of magnetic material on the piezoelectric material film, the dimension of the magnetic material film being about the same as that of the first electrode material film; and (ii) etching the substrate. The first electrode material film and the films of piezoelectric material, magnetic material and gold layered on top of it form a heterostructure. The heterostructure is released from the substrate for vibrating freely to allow optimal coupling between magnetic, elastic, and electric fields encountered by the heterostructure while being supported by the substrate through minimal clamping.

In one embodiment, the etching in step (c) is performed by $H_3PO_4$.

In one embodiment, the etching in step (d) is performed by chlorine-based inductively coupled plasma (ICP).

In one embodiment, an in-situ magnetic field bias is applied while depositing the magnetic material (step (e)) along an anchor direction of the device to pre-orient magnetic domains present in the magnetic material. The strength of the in-situ magnetic field can be between 75 Oe and 150 Oe. In one embodiment, the strength of the in-situ magnetic field is 100 Oe.

In one embodiment, the substrate is etched using $XeF_2$ isotropic etching.

In a further aspect, the invention provides a device including an NME antenna according to any one of the NME antenna embodiments described above.

In yet another aspect, the invention provides a device including an NME antenna array according to any one of the NME antenna array embodiments described above.

The invention can be further summarized by the following list of embodiments.

1. A nanomechanical magnetoelectric (NME) antenna comprising:
  a thin film heterostructure having a magnetic element and a piezoelectric element, wherein the heterostructure is (i) suspended on a substrate, and (ii) capable of resonating at acoustic resonance frequencies;
wherein in a transmission mode, oscillating mechanical strain produced by voltage induced acoustic waves is transferred to the heterostructure through strain mediated magnetoelectric coupling, leading to magnetization oscillation that radiates electromagnetic waves at the acoustic resonance frequencies; and wherein in a receiving mode, the heterostructure senses magnetic components of electromagnetic waves arriving at the antenna, converting the magnetic components into a piezoelectric voltage output.

2. The NME antenna of embodiment 1, wherein the mode of vibration excited in the piezoelectric layer by the magnetic field and the electric field are the same.

3. The NME antenna of embodiment 1 or embodiment 2, wherein the substrate is a high resistivity silica wafer.

4. The NME antenna of embodiment 1 or embodiment 2, wherein the magnetic element comprises a FeGaB/AlO$_x$ multilayer made of alternating layers of an alloy of Fe, Ga, and B (FeGaB) and AlO$_x$.

5. The NME antenna of any of embodiments 1-4, wherein the piezoelectric layer comprises at least one piezoelectric material selected from the group consisting of: aluminum nitride, lithium niobate, lithium tantalate, zinc oxide, gallium nitride, and quartz.

6. The NME antenna of embodiment 5, wherein the piezoelectric element is a thin film made of aluminum nitride (AlN).

7. The NME antenna of embodiment 6, wherein the thickness of the AlN thin film is between 350 nm and 650 nm.

8. The NME antenna of embodiment 7, wherein the thin film is about 500 nm thick.

9. The NME antenna of embodiment 4, wherein the thickness of the FeGaB/AlO$_x$ multilayer is between 350 and 650 nm.

10. The NME antenna of embodiment 9, wherein the FeGaB/AlO$_x$ multilayer is about 500 nm thick.

11. The NME antenna of any of embodiments 1-10, wherein the frequency of the radiated electromagnetic waves ranges from 10 MHz to 10 GHz. 12. The NME antenna of embodiment 11, wherein the frequency of the radiated electromagnetic waves ranges from 60 MHz to 2.5 GHz.

13. The NME antenna of any of embodiments 1-12, wherein the thin film heterostructure is rectangular.

14. The NME antenna of embodiment 13, wherein the heterostructure exhibits an in-plane contour mode of vibration ($d_{31}$ mode).

15. The antenna of embodiment 13, wherein the length and the width of the thin film heterostructure range from 100 μm to 400 μm and from 25 μm to 100 μm, respectively.

16. The antenna of embodiment 15, wherein the length ranges from 150 μm to 300 μm.

17. The NME antenna of embodiment 15, wherein the width ranges from 35 μm to 75 μm.

18. The NME antenna of embodiment 13, wherein ME coupling constant of 4 kV $Oe^{-1}$ $cm^{-1}$ to 8 kV $Oe^{-1}$ $cm^{-1}$ is obtained in the absence of a DC bias magnetic field.

19. The NME antenna of embodiment 18, wherein the ME coupling constant is about 6 kV $Oe^{-1}$ $cm^{-1}$.

20. The antenna of any of embodiments 1-8, wherein the thin film heterostructure is circular.

21. The antenna of embodiment 20, wherein the thin film heterostructure has a diameter ranging from 100 μm to 400 μm.

22. The antenna of embodiment 21, wherein the diameter ranges from 150 μm to 250 μm.

23. A nanomechanical magnetoelectric (NME) antenna array comprising:
- a plurality of thin film heterostructures suspended on a substrate, wherein, each of said plurality of heterostructures (i) includes a magnetic element and a piezoelectric element, (ii) is rectangular or circular in shape; and (iii) is capable of resonating at acoustic resonance frequencies;
- wherein in A transmission mode, oscillating mechanical strain produced by voltage induced acoustic waves is transferred to each of said plurality of heterostructures through strain mediated magnetoelectric coupling, leading to magnetization oscillation (or magnetic current) that radiate electromagnetic waves at the acoustic resonance frequencies ranging from 10 MHz and 10 GHz; and in a receiving mode, each of said plurality of heterostructures senses magnetic components of electromagnetic waves arriving at the antenna, converting the magnetic components into a piezoelectric voltage output.

24. The array of embodiment 23, wherein the substrate is a high resistivity silica wafer.

25. The array of embodiment 23 or embodiment 24, wherein the magnetic element comprises a FeGaB/AlO$_x$ multilayer made of alternating layers of an alloy of Fe, Ga, and B (FeGaB) and AlO$_x$.

26. The array of any of embodiments 23-25, wherein the piezoelectric element comprises at least one piezoelectric material selected from the group consisting of: aluminum nitride, lithium niobate, lithium tantalate, zinc oxide, gallium nitride, and quartz.

27. The array of embodiment 26, wherein the piezoelectric element is a thin film made of aluminum nitride (AlN).

28. The array of embodiment 27, wherein the thickness of the AlN thin film is between 350 nm and 650 nm.

29. The array of embodiment 28, wherein the AlN thin film is about 500 nm thick.

30. The array of embodiment 25, wherein the thickness of the FeGaB/AlO$_x$ multilayer is between 350 nm and 650 nm.

31. The array of embodiment 30, wherein the FeGaB/AlO$_x$ multilayer is about 500 nm thick.

32. A method of fabricating a nanomechanical magnetoelectric antenna device, the method comprising:
(a) providing a high resistivity substrate and depositing a film of a first electrode material on the substrate, partially covering the substrate;
(b) depositing a film of piezoelectric material covering the first electrode material and the substrate;
(c) etching a first via in the piezoelectric material thereby exposing the substrate, wherein the via is located at one extremity of the first electrode material film;
(d) etching a second via in the piezoelectric material film at a location of the substrate not covered by the first electrode material film;
(e) depositing a film of gold on the piezoelectric material film and patterning to form a top ground;
(f) depositing a film of magnetic material on the piezoelectric material film, the dimension of the magnetic material film being about the same as that of the first electrode material film; and
(ii) etching the substrate,
wherein, the first electrode material film and the films of piezoelectric material, magnetic material and gold layered on top of it form a heterostructure, wherein the heterostructure is released from the substrate for vibrating freely to allow optimal coupling between magnetic, elastic, and electric fields encountered by the heterostructure while being supported by the substrate through minimal clamping.

33. The method of embodiment 32, wherein the etching in step (c) is performed by H$_3$PO$_4$.

34. The method of embodiment 32, wherein the etching in step (d) is performed by chlorine-based inductively coupled plasma (ICP).

35. The method of embodiment 32, wherein an in-situ magnetic field bias is applied while depositing the magnetic material (step (e)) along an anchor direction of the device to pre-orient magnetic domains present in the magnetic material.

36. The method of embodiment 32, wherein the strength of the in-situ magnetic field is between 75 Oe and 150 Oe.

37. The method of embodiment 32, wherein the substrate is etched using XeF$_2$ isotropic etching.

38. A device comprising an NME antenna according to any one of embodiments 1 to 22.

39. A device comprising A nanomechanical magnetoelectric (NME) antenna array according to any one of embodiments 23 to 31.

BRIEF DESCRIPTION OF THE DRAWINGS

The foregoing and other features of the present invention, the various features thereof, as well as the invention itself, may be more fully understood from the following description, when read together with the accompanying drawings. The drawings are presented for the purpose of illustration only and are not intended to limit the invention.

FIG. 4A shows a magnetic hysteresis loop. FIG. 4B shows a ferromagnetic resonance spectrum of FeGaB/$AlO_x$ multilayers.

FIG. 5A shows deposition and patterning, of a thin film of platinum (Pt) on a Si substrate. The Pt thin film serves as an electrode (bottom electrode). FIG. 5B shows deposition of a thin film of AlN on the Si substrate and the Pt thin film, covering both, and etching of the AlN thin film to generate a via exposing the underlying substrate. FIG. 5C shows further etching of the AlN thin film to generate another via.

DETAILED DESCRIPTION OF THE INVENTION

The present invention provides ultra-compact magnetoelectric (ME) nanoelectromechanical system (NEMS) antennas based on acoustic resonance in NEMS resonators. The invention further provides a method for making such antennas.

The antennas described herein are made with one of two kinds of resonators, namely magnetoelectric nano-plate resonators (NPR) and thin-film bulk acoustic resonators (FBAR). The resonant body of an embodiment of each of these ME NEMS resonators is made of a patterned AlN/FeGaB thin film ME heterostructure. This heterostructure is fully suspended on a substrate (e.g., a Si substrate). AlN and FeGaB components constitute the piezoelectric and ferromagnetic elements, respectively, of the heterostructure (see FIG. 4 for a characterization of the magnetic properties of the heterostructures). Use of NEMS resonators with ultra-thin 500 nm AlN thin film enables on-chip transduction with low power consumption[15,16]. Importantly, these ME NEMS resonators sense RF magnetic field associated with EM waves that are near their electromechanical resonance frequencies. Also, they radiate EM waves when driven by RF voltage signal near their electromechanical resonance frequencies.

The ME antennas of the present invention exhibit strong coupling between acoustic wave propagating in the resonant body and the EM wave that is radiated by them. Specifically, RF electric field applied to the AlN layer (piezoelectric component) of the NEMS ME resonators induces mechanical resonance in the AlN/FeGaB thin film resonating plate as alternating strain/acoustic waves through strain-mediated ME coupling[17,18]. The acoustic waves propagating in the magnetic layer, which owing to the strong piezomagnetic constant of FeGaB induces a dynamic change in magnetization due to piezomagnetic effects, give rise to magnetic currents that radiate EM waves[19,20]. Reciprocally, the RF magnetic field associated with EM waves can lead to magnetization oscillation of the FeGaB ferromagnetic layer and induce acoustic waves in the magnetic layer due to converse piezomagnetic effect. These acoustic waves are transferred to the piezoelectric AlN thin film through ME coupling, thereby generating a dynamic voltage output due to direct piezoelectric coupling. A wide reconfigurable frequency band from 60 MHz to 2.5 GHz is realized by exciting different modes of vibration in ME resonators with different designs. These designs include rectangular shaped nano-plate resonator (NPR), and circular disk shaped thin-film bulk acoustic resonator (FBAR). Proof of concept underlying the operation of the antennas of the present invention was found in the high ME coupling coefficient observed upon using an NPR with an in-plane contour mode of vibration ($d_{31}$ mode).

Figures 1A, 1B, 1C, 1D, 1E, 1F, 1G, 1H:
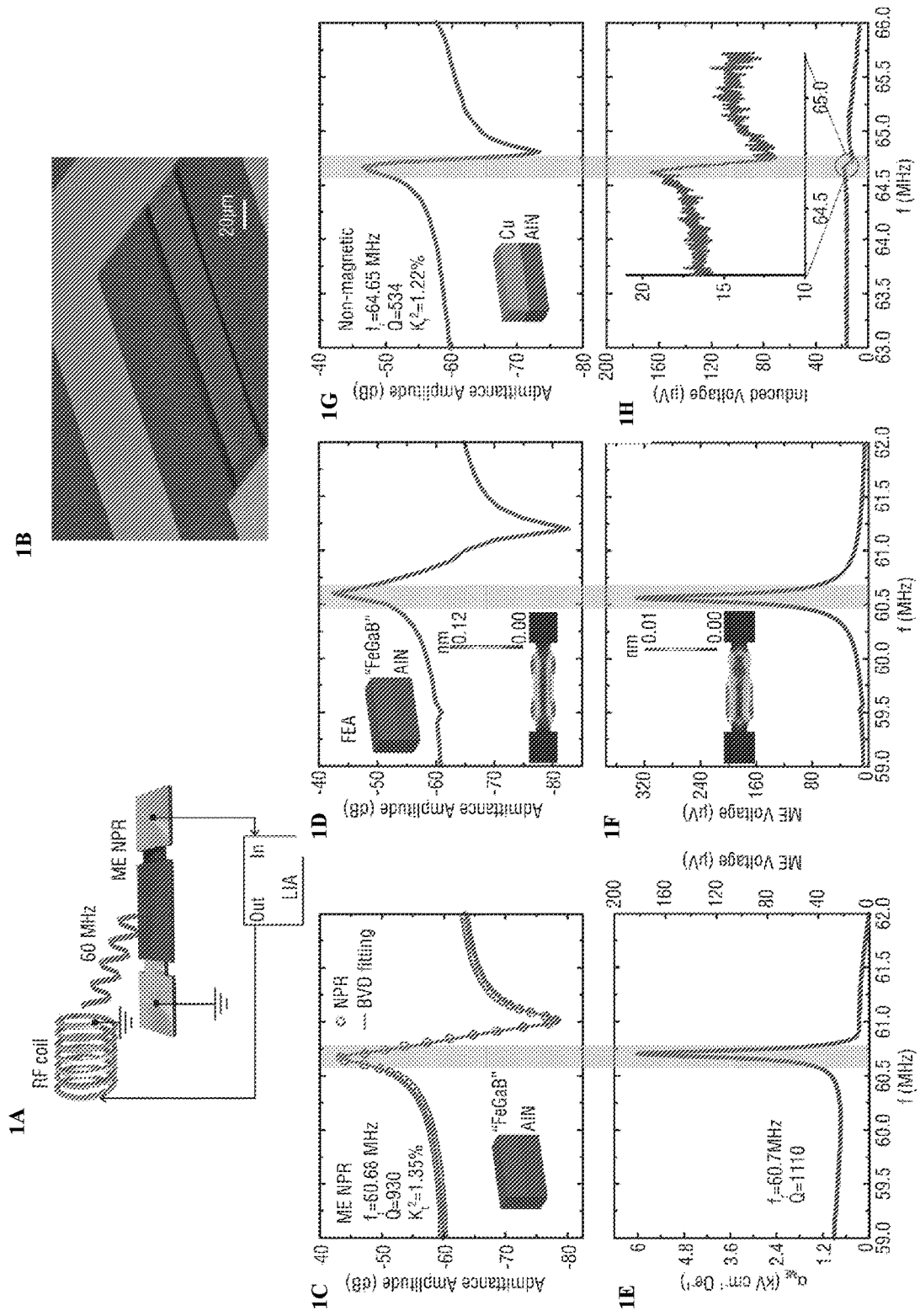
FIG. 1A is a schematic diagram of a magnetoelectric (ME) nano-plate resonator (NPR) device that uses a (radiofrequency) RF coil to produce a magnetic field and a high frequency lock-in amplifier (HFLIA) for measuring voltage output.
FIG. 1B is a scanning electron microscopy (SEM) image of an ME NPR (FIG. 1A). The red and blue areas show a suspended single nano-plate resonator with AlN/FeGaB ME heterostructure and AlN anchors, respectively. The yellow area presents the RF ground-signal-ground (GSG) electrode.
FIG. 1C is an admittance curve and Butterworth-van Dyke (BVD) model fitting of the ME NPR with a resonance frequency of 60.68 MHz, quality factor of 930, and electromenchanical coupling coefficient of 1.35%. The inset shows a schematic of the cross-section of the ME hetero structure. "FeGaB" denotes (FeGaB/AlO$_x$)×10 multilayer.
FIG. 1D is a graph showing a finite element analysis (FEA) on the admittance curve of the ME NPR. The bottom inset shows the in-plane displacement of the nano-plate at peak resonance position.
FIG. 1E shows a curve for change in ME coupling coefficient (left-axis) and induced ME voltage (right-axis) as a function of frequency of the excitation RF magnetic field.
FIG. 1F is a graph showing a FEA of the induced ME voltage measurement of the ME NPR. Inset shows the in-plane displacement excited by the RF magnetic field.
FIG. 1G is an admittance curve of a control non-magnetic NPR having a design similar to that of the ME NPR device of FIG. 1A. Inset shows a schematic of the cross-section of the control non-magnetic NPR.
FIG. 1H is a plot of induced voltage versus frequency for the control non-magnetic NPR. Inset illustrates a zoomed-in view of the resonance peak area (red circle).

FIG. 1A presents a schematic diagram of the experimental setup for operation of the antenna. The setup includes an ME NPR that has a rectangular resonating plate consisting of a bottom Pt electrode and a thin film AlN/FeGaB heterostructure. All of the ME NEMS resonators described herein were fabricated using postcomplementary metal-oxide-semiconductor (CMOS) compatible microfabrication process (see FIGS. 5A-5E). The Scanning Electron Microscopy (SEM) image of an NPR ME resonator according to the present invention is shown in FIG. 1B. The length L and width W of the active resonant body are 200 μm and 50 μm respectively. The ME nanoplate is fully released from the Si substrate while still being mechanically supported and electrically contacted by the AlN and Pt anchors for optimized magnetoelectric coupling. The ME nanoplate is minimally clamped by the substrate. The electromechanical properties of the ME NPR were studied by measuring electrical admittance amplitude of the NPR using a network analyzer in the frequency range 59 to 62 MHz. These measurements resulted in the electrical admittance spectrum shown in FIG. 1C. This spectrum was fitted to the Butterworth-van Dyke (BVD) model, which yielded a resonance frequency $f_{0,NPR}$ of 60.68 MHz, a high quality factor Q of 930, and electro-mechanical coupling coefficient $K^2_t$ of 1.35%, indicating high electromechanical transduction efficiency and low loss (FIG. 6). This resonance frequency corresponds to the contour mode of vibration excited in AlN, which can be analytically expressed as $$f = \frac{1}{2W}\sqrt{\frac{E}{\rho}}, f_{0,NPR} \propto \frac{1}{2W_0}\sqrt{\frac{E}{\rho}},$$

where $W_0$ is the width of the resonator pitch, E and ρ are equivalent Young's modulus and equivalent density of the resonator respectively[21-23]. Finite element analysis (FEA) performed on the admittance curve of the device with the same geometry as that of the device shown in FIG. 1A is shown in FIG. 1D, which is in a good agreement with FIG. 1C. At the resonance frequency of 60.56 MHz, in-plane displacement distribution indicates a width contour extensional mode of vibration (see inset of FIG. 1D inset). Notably, the quality factor (Q) of this ME resonator was very high compared to conventional low frequency ME hetero-structures described in the previous reports[7, 24-27].

Figure 7:
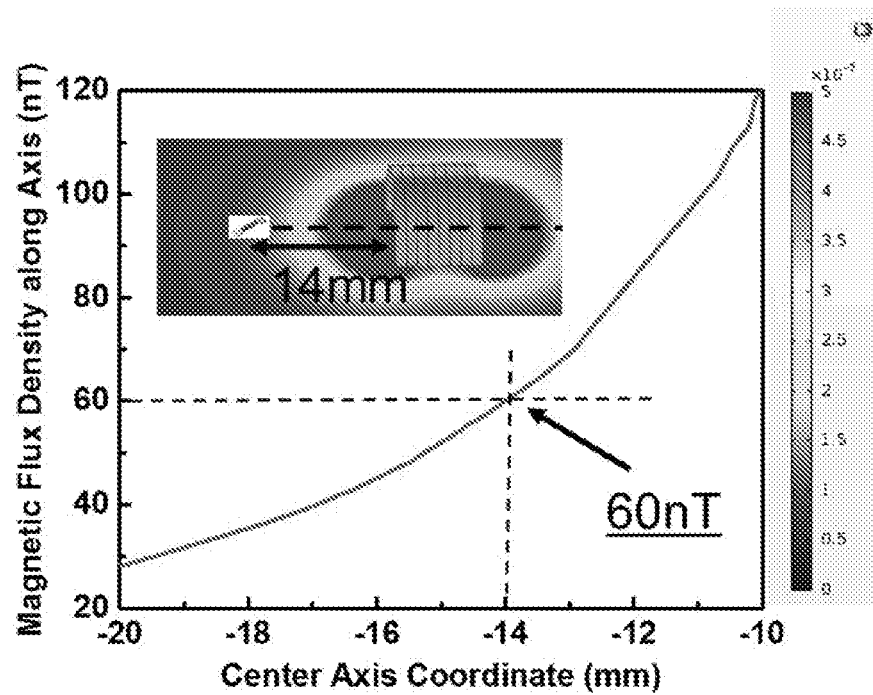
FIG. 7 is a graph showing variation in magnetic flux density as a function of center axis coordinate (x). The device under test is placed at x=−14 mm. At this position, the magnetic flux density applied to the device is 60 nT at 60.7 MHz. Inset shows distribution of magnetic flux density in the space.

FIG. 1E shows the magnetoelectric voltage output induced in the RF magnetoelectric antennas by an RF magnetic field. The output was measured using an ultrahigh frequency lock-in amplifier (UHFLI) as a function of frequency (see right-axis). The magnetic field, with a simulated strength of Hrf=60 nT, was applied by a RF coil along the direction of the length of the resonator (FIG. 7). A clear resonance peak at 60.7 MHz with a peak amplitude of 180 μV was obtained. The amplitude of the peak was found to be very sensitive to the excitation frequency, thereby yielding a quality factor Q of 1110, which is very close to that of the admittance curve shown in FIG. 1C. This is also in a good agreement with the FEA results of the ME voltage spectrum shown in FIG. 1F which shows a peak amplitude of 196 μV.

FIG. 1F shows in-plane displacement of the ME resonator excited by an RF magnetic field at the resonance frequency (see inset). The in-plane displacement denotes a width extensional $d_{31}$ mode. The fact that the mode of vibration excited by the magnetic and the electric fields are the same demonstrates that strain mediated ME coupling is dominant. A very high ME coupling coefficient of $\alpha=\partial U/(\partial Hrf \cdot d)=6$ kV $Oe^{-1}$ $cm^{-1}$ can be derived at the electromechanical resonance frequency, where U is the induced ME voltage, Hrf is the applied alternative magnetic field, and d is the thickness of AlN layer[18,28]. It is noteworthy that this ME coupling α is obtained without any DC bias magnetic field, and the value is comparable with reports of α with optimum bias magnetic field at low frequencies[33].

Non-magnetic single-finger nano-plate resonators (FIGS. 1G and 1H), and magnetoelectric nano-plate resonators with multi-finger interdigitated electrode were also designed, fabricated, and tested to confirm that the observed voltage output under RF magnetic field excitation in FIG. 1E was a result of strain-mediated ME coupling. For the non-magnetic resonator, a Cu film on AlN (FIG. 1G inset) was used to replace the FeGaB/AlN magnetoelectric heterostructure shown in FIGS. 1C and 1D. The Cu/AlN based nano-pate resonator exhibited a similar admittance behavior (FIG. 1G) as the magnetoelectric NPR (FIG. 1C). However, the voltage induced in the Cu/AlN based nano-pate resonator, measured as a function of frequency under the same RF magnetic field excitation Hrf=60 nT) as that used for the magnetic NPR (see FIG. 1H), was found to be two orders of magnitude smaller and significantly different from the voltage induced in the magnetoelectric NPR (FIG. 1D). The voltage induced in the Cu/AlN based nano-pate resonator could result from inductive coupling between the resonator ground loop and the electric field component of the EM wave. Voltage output resulting from in-plane uniform strain in the FeGaB/AlN heterostructure (excited by the magnetic field from electromagnetic waves) in the magnetoelectric nano-plate resonators with multi-finger interdigitated electrode was also found to be negligibly small (near zero voltage output between in-plane interdigitated electrodes). This result was also verified through simulation.

Figure 2A:
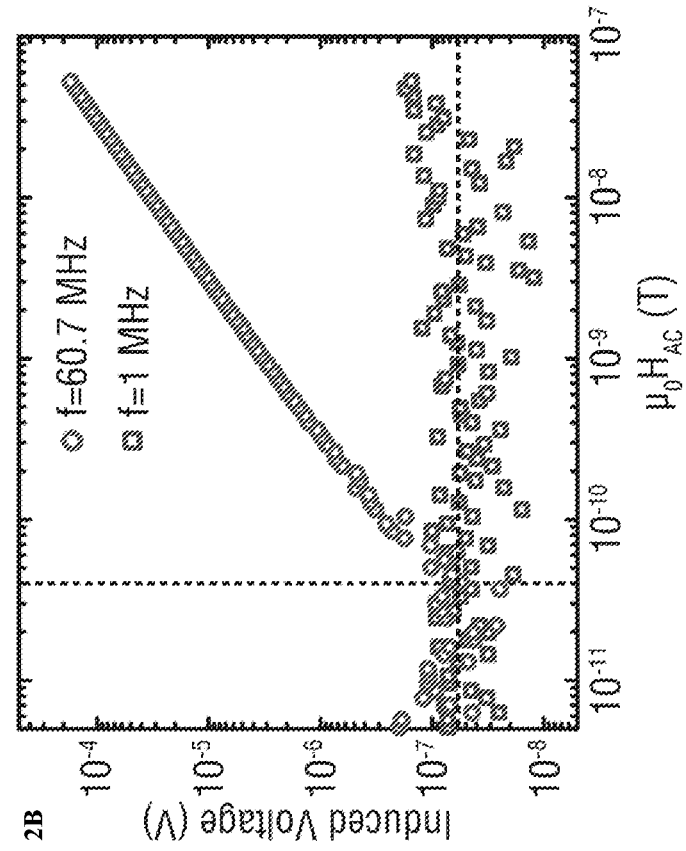
FIG. 2A shows ME coupling coefficient of the ME NPR at its resonance frequency as a function of bias DC magnetic field.

To further characterize the ME NPR, its magnetization dependence was analyzed by examining the ME coupling strength at different bias magnetic fields. FIG. 2A shows direct magnetoelectric coupling coefficient α at the resonance frequency of 60.7 MHz plotted as a function of DC magnetic field bias. Similar to the strain-mediated ME coupling mechanism, a hysteresis behavior was observed with the maximum value at ±0.5 mT, which is also observed in other conventional magnetoelectric heterostructures at low frequencies[17,24,30], and can be linked to the magnetic hysteresis of FeGaB thin film. This provides another direct evidence that the observed interaction between EM wave and acoustic resonance in magnetoelectric NPR arises from the ME coupling between the ferromagnetic and ferroelectric phases in the resonant NPR structure. However, the strong magnetoelectric coupling coefficient at zero magnetic field and the relatively weak dependence of ME coupling coefficient on bias magnetic field are drastically different from conventional magnetoelectric heterostructures with electromechanical resonance frequencies in the kilohertz frequency range. These may be due to the locked magnetic domain states and edge curling wall[31] under self-bias condition for the magnetic/non-magnetic multilayers in the FeGaB/AlO$_x$ multilayers. Of note, all conventional magnetoelectric sensors need a uniform bias magnetic field[32,33] or an exchange bias magnetic field[8], which are hard or inconvenient to realize. In contrast, the ME NPR of the invention does not need an external DC magnetic field to set the optimum working condition due to the self-bias behavior, which enables integration and miniaturization of the sensing system such as the antenna described herein.

Figure 2B:
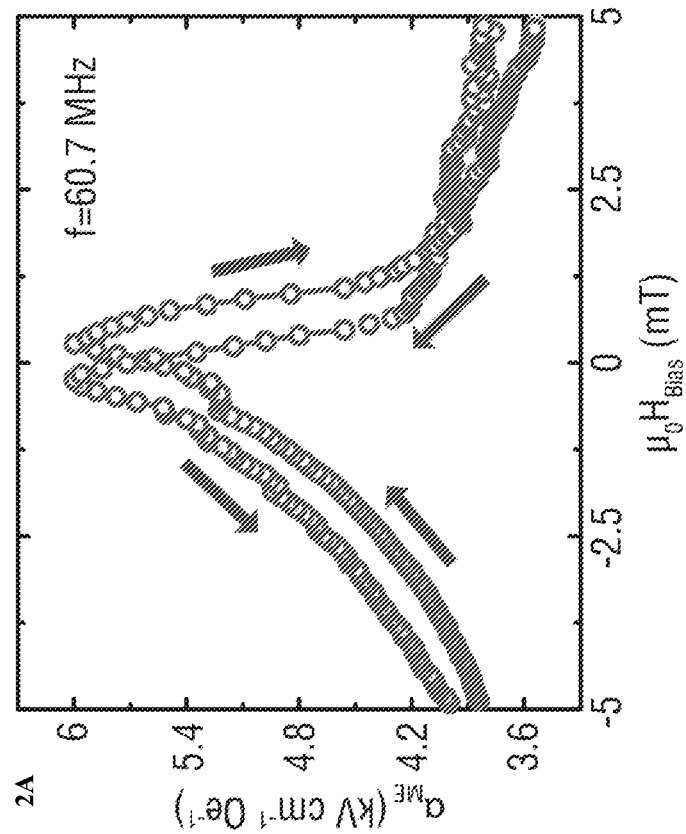
FIG. 2B shows induced ME voltage as a function of magnetic field at RF magnetic field excitation frequency of 60.7 MHz (red) and 1MHz (blue).

The limit of detection of the ME NPR for sensing weak RF magnetic fields under zero bias magnetic field was also determined. FIG. 2B shows the induced voltage plotted as a function of RF magnetic field at two different excitation frequencies. At the resonance frequency of 60.7 MHz (red), the linear curve scatters at 40 pT and a limit of detection voltage of 0.1 μV is obtained. On the other hand, at the off-resonance frequency of 1 MHz (blue), the induced voltage randomly distributes around the 0.1 μV showing no sensitivity to 1MHz magnetic excitation with amplitude of $10^{11}$T~$10^{-7}$ T. Furthermore, an array of multiple frequency bands can be integrated in one wafer by designing single-finger magnetoelectric NPRs with different lateral dimensions (or width W), since the electromechanical resonance frequency of magnetoelectric NPRs is inversely proportional to W. As a result, the electromechanical resonance frequency can be set to different frequencies from MHz to GHz range[16, 22].

Figures 3A, 3B, 3C, 3D, 3E, 3F:
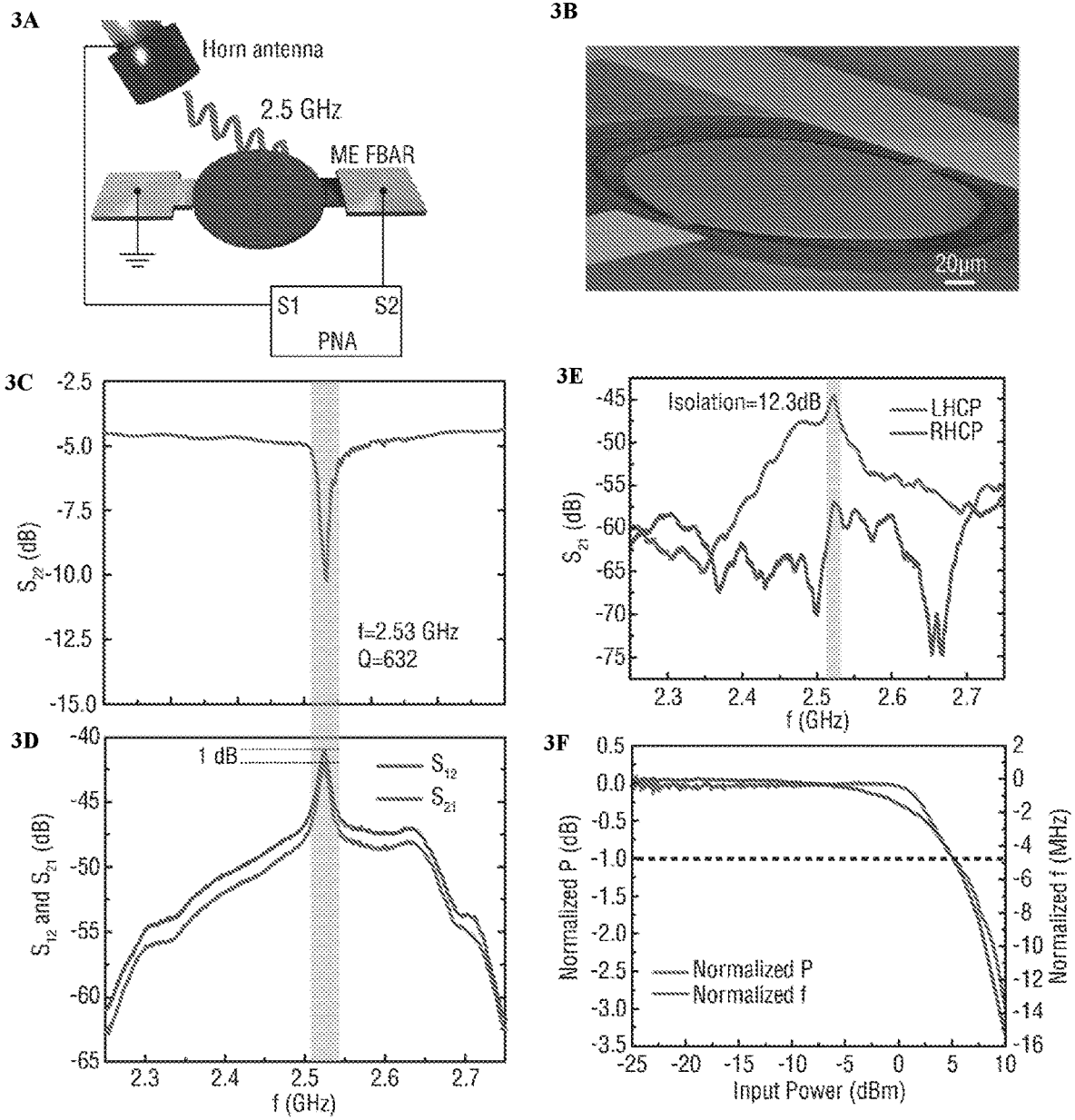
FIG. 3A shows a schematic diagram of a ME thin-film bulk acoustic resonator (FBAR) antenna and a measurement setup for the antenna. The horn antenna and ME FBAR are connected to the $S_1$ and $S_2$ port of a network analyzer.
FIG. 3B is an SEM image of the ME FBAR. The red and blue areas show the suspended circular plate and AlN anchors, respectively. The yellow area presents the GSG electrode.
FIG. 3C is a reflectivity curve ($S_{22}$) of the ME FBAR shown in FIGS. 3A and 3B.
FIG. 3D shows curves for reverse ($S_{12}$, blue) and forward ($S_{21}$, red) gains of the ME FBAR.
FIG. 3E shows curves for left-hand circular polarization (LHCP; upper curve) and right-hand circular polarization (RHCP; lower curve) measurements for forward gain ($S_{21}$) of the ME FBAR.
FIG. 3F shows normalized output power and normalized resonance frequency as a function of input power for power handling capacity measurement.

The antenna of the invention was also characterized for its radiation behavior in a far-field configuration at GHz range. This was done by using a magnetoelectric thin film bulk acoustic wave resonator (FBAR) device consisting of a circular magnetoelectric resonating disk. As shown in FIGS. 3A and 3B, the active element of ME FBAR device is a suspended circular ME disk with a diameter of 200 μm, with 500 nm AlN and 500 nm FeGaB, which exhibits a thickness extensional mode ($d_{33}$ mode) of vibration (FIG. 3A). The calibrated standard linear polarization horn antenna and a FBAR device are connected to the port 1 and port 2 of a network analyzer, respectively for antenna gain measurements. In contrast to the NPR, the resonance frequency of FBAR is defined by the thickness of the AlN thin film and can be expressed by $$f \propto \frac{1}{2T}\sqrt{\frac{E}{\rho}} \; f = \frac{1}{2T}\sqrt{\frac{E}{\rho}},$$

where T is the thickness of the AlN/FeGaB heterostructure. The electromechanical resonance frequency $f_{0,FBAR}$ was found at 2.525 GHz by measuring the reflection coefficient ($S_{22}$) of the FBAR device as shown in FIG. 3C, which also exhibits a peak return loss of 10.26 dB and quality factor Q of 632. The transmitting and receiving behavior of the FBAR magnetoelectric antennas was characterized and the obtained reverse ($S_{12}$) and forward ($S_{21}$) transmission are shown in FIG. 3D, in which strong resonance peaks were observed at $f_{0,FBAR}$, the electromechanical resonance frequency of the magnetoelectric FBAR. As was demonstrated with regard to the proof of concept results in the case of ME NPR, here too the $S_{21}$ and $S_{12}$ curves were obtained at zero bias magnetic field. The antenna gain for the magnetoelectric FBAR, determined using the gain comparison method with the measured $S_{12}$ data, was found to be −18 dBi at the electromechanical resonance frequency of 2.53 GHz. It is noteworthy that the FBAR based ME antenna also showed a non-reciprocal behavior of $S_{12}$ and $S_{21}$ curves at zero bias magnetic field across a very wide frequency band due to magnetostatic surface wave[34,35], further confirming that the coupling between the EM wave and ME antenna is through the ME heterostructure, not through the ground loop of the ME antenna. The $S_{12}$ values were higher than $S_{21}$ values by 1 to 2 dB across a wide frequency band between 2.25~2.7 GHz, indicating that the magnetoelectric FBAR based antenna has slightly higher gain for transmitting electromagnetic waves compared to receiving process due to the way that the magnetoelectric antenna interacts with electromagnetic waves.

Since magnetization couples to right-hand circularly polarized (RHCP) RF magnetic fields much more efficiently compared to left-hand circularly polarized (LHCP) RF magnetic waves 36, the ME antennas of the invention may also be circularly polarized antennas. Circular polarization behavior the ME FBAR antenna was therefore tested by using another calibrated circularly polarized antenna. FIG. 3E shows a graph that shows the $S_{21}$ curve (magnetoelectric antenna as the receiving antenna) of the ME FBAR antenna with Left-hand Circular Polarization (LHCP) and Right-Hand Circular Polarization (RHCP) electromagnetic wave excitation. In good agreement with FIG. 3D, a resonance peak at 2.53 GHz was still observed in the $S_{21}$ curve with LHCP input. This peak was much higher than the $S_{21}$ curve obtained with the RHCP input. At the electromechanical resonance frequency of 2.53 GHz, the $S_{21}$ curves with LHCP and RHCP inputs were clearly separated (a difference of 12.3 dB). The higher amplitude of the LHCP curve demonstrates that the ME FBAR is a LHCP antenna.

Similar effect and separation was also observed in FBAR radiation with the FBAR magnetoelectric antenna as the transmitting antenna (i.e., $S_{12}$ measurement) again indicating that the self-biased ME antennas based on NEMS ME FBARs described herein are essentially LHCP antennas. LHCP antennas have the capability for mitigating multipath interference and are widely used on satellites such as GPS (Global Positioning System). However, achieving this capability in miniature antenna has been difficult. FIG. 3F shows the linearity of the ME FBAR antenna. Specifically, it shows the normalized power to reach the −1 dB compression point (IP1dB) as the input power increases to 5 dBm (3.16 mW). Improvement in the normalized power through modification of the designs of the ME NEMS FBARs having improved heat transfer features is within the contemplation of the invention.

The circularly polarized ME FBAR antenna described herein is highly anisotropic due to magnetic film shape anisotropy and most sensitive along the hard axis direction of the magnetic film. This is evident from the quantification of antenna gain, directivity, and radiation efficiency of these antennas based on ME FBAR devices with one pair of well-calibrated horn antennas. Directivity D of the ME FBAR antenna can be calculated by integrating the magnetic power density as:

$$D = \frac{\int_0^P \int_0^\pi \int_0^\pi \rho \sin\theta \sin\phi d\theta d\phi d\rho}{\int_0^P \rho d\rho} = 6 \text{ dB},$$

where $P(\rho,\phi,\theta)$ is the magnetic power density in spherical coordinates. The ME FBAR antenna efficiency can be calculated as $\xi_{rad}=G_{FBAR}/D=0.403\%$ with a high gain of $G_{FBAR}=-18$ dBi at the resonance frequency $f_{0,FBAR}$, or $\xi_{rad,\,corrected}=0.448\%$ with reflection corrected. The FBAR magnetoelectric antenna also has a fractional bandwidth $$FBW_{FBAR} = \frac{\Delta f}{f_0} = \frac{BW}{f_0} = 0.158\%$$

with the measured 3 dB bandwidth Δf=4 MHz. The minimum quality factor Q of a small antenna is given by $$Q = \frac{1}{(k_0 a)^2} + \frac{1}{k_0 a} = 41037$$

as dictated by the Chu limit[38]

$$Q = \frac{1}{(k_0 a)^3} + \frac{1}{k_0 a},$$

where $$k_0 = \frac{2\pi}{\lambda}$$

is the wave number in free space and α is the smallest imaginary sphere of radius enclosed the entire antenna structure. The maximum fractional bandwidth of this antenna of the magnetoelectric antenna allowed by the Chu's limit[38] is therefore $$FBW_{Chu} \approx \frac{VSWR - 1}{\xi_{rad,corrected} Q \sqrt{VSWR}} = 0.628\%,$$

which is still larger than the measured $$FBW_{FBAR} = \frac{\Delta f}{f_0} = \frac{BW}{f_0} = 0.158\%.$$

Figure 8:
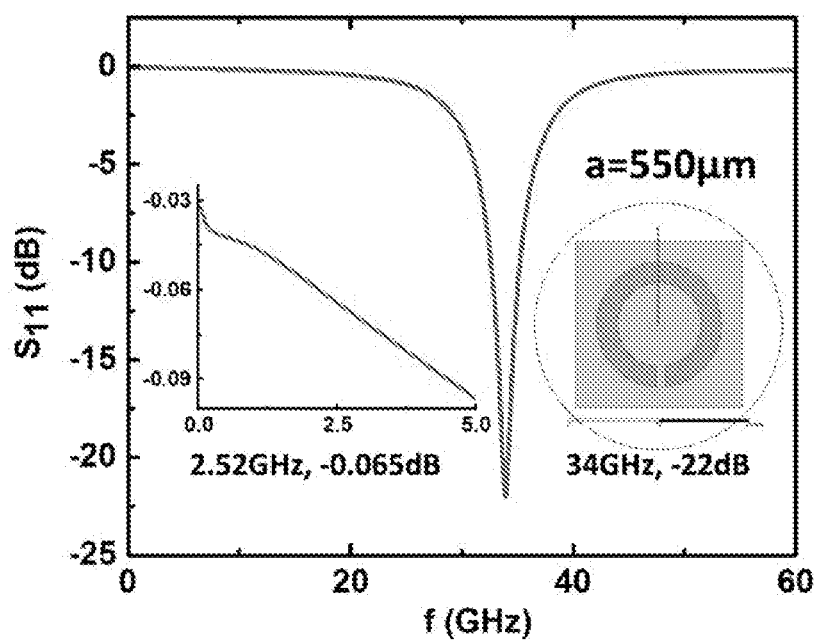
FIG. 8 is a graph showing a simulated reflection coefficient ($S_{11}$) of a small loop antenna. The reflection peak occurs at 34 GHz with a return loss of −22 dB and quality factor <10. The left inset shows the zoomed-in area in the frequency range from 0 to 5 GHz. At 2.52 GHz (the resonance frequency of ME FBAR antenna), the return loss is −0.065 dB. The right inset shows a schematic diagram of the simulated small loop antenna.

The ultra-miniaturized ME FBAR antenna with a resonating ME circulating disk has a size of φ200 μm (including the ground loop of φ550 μm, which corresponds to $\lambda_0/593$ ($\lambda_0/216$). These ME antennas have sizes one to two orders of magnitude smaller than state of the art compact antennas with their sizes over $\lambda_0/10$. As a comparison, the small loop antenna with φ550 μm, or the same size with the ground ring of the magnetoelectric antenna, shows a resonance frequency fr,loop of 34 GHz (see FIG. 8) and a much smaller gain of −68.4 dBi at 2.5 GHz due to poor impedance match, compared to −18 dBi gain of the ME FBAR antenna. Clearly these ultra-compact circular polarized ME antennas have drastically enhanced antenna gain compared to state of the art antennas, with 50 dB gain over the same-size compact loop antenna. Compared with the recently reported miniaturized UHF antenna designs (see Table 1 below), the ME antenna has several orders of magnitude smaller thickness and footprint, while maintains a high antenna gain.

TABLE 1

| f (GHz) | Thickness | Footprint | Gain (dBi) | Integrated circuit | Ref. |
|---|---|---|---|---|---|
| 0.47 | $\lambda_0/168$ | 0.36 $\lambda_0$ × 0.2 $\lambda_0$ | −4.5 | No | 1 |
| 1.2 | $\lambda_0/47$ | 0.08 $\lambda_0$ × 0.065 $\lambda_0$ | N/A | No | 2 |
| 1.57 | $\lambda_0/40$ | 0.16 $\lambda_0$ × 0.16 $\lambda_0$ | −5.5 | No | 3 |
| 2.45 | $\lambda_0/245$ | 0.045 $\lambda_0$ × 0.0041 $\lambda_0$ | −46 | No | 4 |
| 2.84 | $\lambda_0/10$ | 0.28 $\lambda_0$ × 0.22 $\lambda_0$ | 1.51 | No | 5 |
| 2.53 | $\lambda_0/103304$ | 0.0067 $\lambda_0$ × 0.0059 $\lambda_0$ | −18 | Yes | ME antenna |

For example, ME antenna (−18 dBi) shows a much higher gain than a compact helical antenna (−46 dBi) but with 1/4000 of its volume[39]. Moreover, in contrast to the antennas based on printed circuit board (PCB), the ME antenna is fabricated by CMOS compatible photolithography process which is advantageous for IC technology.

To summarize, ultra-compact circularly polarized magnetoelectric nanoelectromechanical system (NEMS) antennas based on ME nano-plate resonators (NPR) and thin film bulk acoustic wave resonators (FBAR) were demonstrated to have sizes that are one to two orders of magnitude smaller than state of the art compact antennas. These ME antennas are excellent sensors and radiators for EM wave. Different modes of vibration are well controlled by the design/shape of the ME antenna for realizing both low (60 MHz) and high (2.525 GHz) resonance frequencies for the radiation. Both NPR (lower frequency) and FBAR resonators (500 MHz~10 GHz) based multiferroic antennas can be fabricated on the same substrate, e.g., a Si wafer, using the same microfabrication process, which allows for broadband multiferroic antenna arrays. These ultra-compact circularly-polarized reconfigurable magnetoelectric antennas have applications in future antennas, for example, in antennas for for internet of things (IoT), smart phones, wireless communication systems, and radars.

EXAMPLES

Example 1. Characterization of FeGaB/AlO$_x$ Magnetic Multilayer

Figures 4A, 4B:
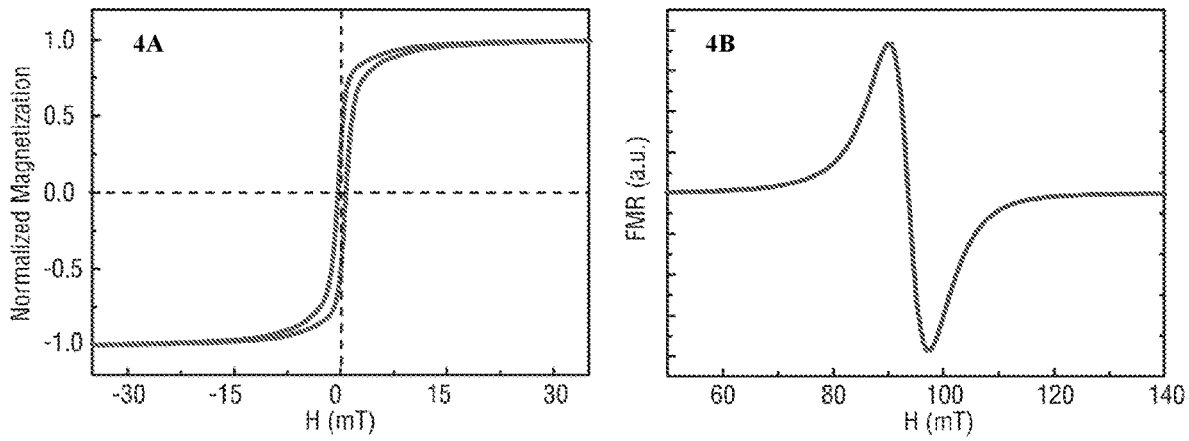
FIGS. 4A and 4B show magnetic properties of FeGaB/ $AlO_x$ multilayers.

Magnetic properties of the FeGaB/AlO$_x$ multilayers used in the ME NPR devices described in the foregoing were characterized both statically and dynamically by a vibration sample magnetometer (VSM) and ferromagnetic resonance spectroscopy (FMR). See FIG. 4. A thin film having the same structure as that of the thin film of the NPR devices of the invention was used for the characterization. The lateral dimensions of the film were 5 mm by 5 mm. Note that there could be a variation in magnetic properties between the reference sample and the device due to differences in shape anisotropy and stress state. As shown in FIG. 4A, the magnetic hysteresis of FeGaB/AlO$_x$ multilayers with a magnetic coercive field of <0.5 mT indicated a soft magnetic property. This is important for achieving large magnetostriction constant and self-bias property of the described ME NPR devices. FIG. 4B is an FMR spectrum of FeGaB/AlO$_x$ multilayers. The spectrum shows the FeGaB/AlO$_x$ multilayers as having a resonance frequency of 93 mT and magnetic moment of 1.15 T based on Kittel equation. A resonance linewidth of 6 mT was obtained demonstrating strong microwave property and low magnetic loss.

Example 2. Device Fabrication Process

Figures 5A, 5B, 5C, 5D, 5E:
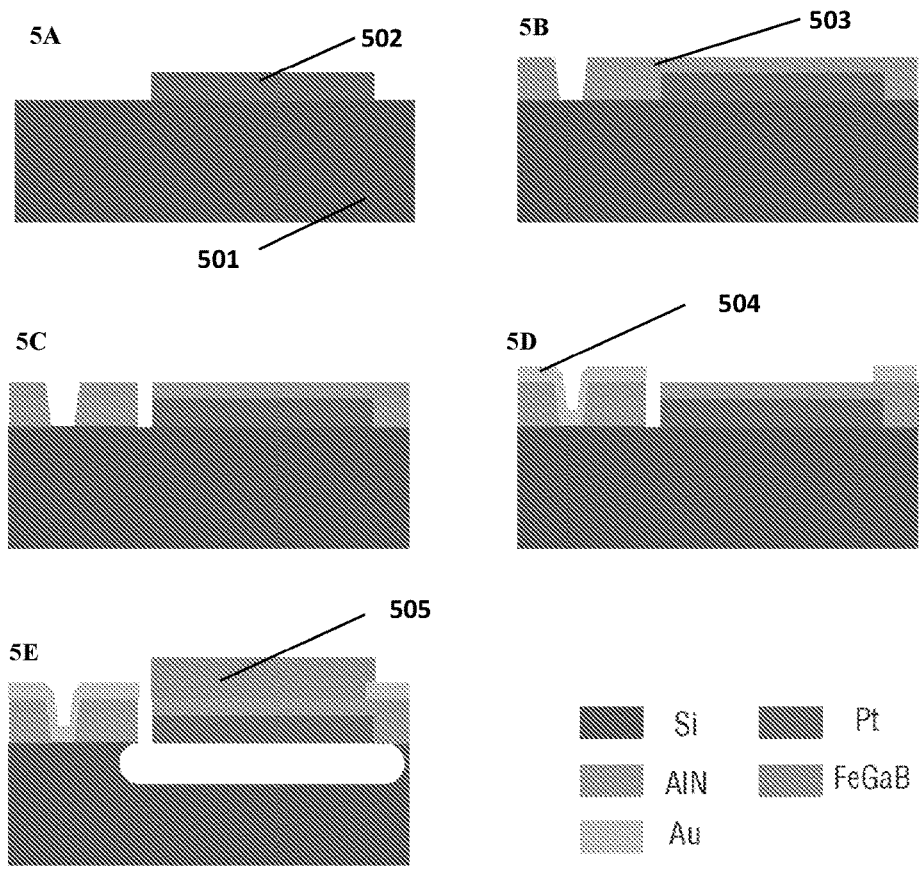
FIGS. 5A-5C show the fabrication process of NPR and FBAR devices.
FIG. 5D shows deposition and patterning of a film of gold (Au) on the AlN thin film. The Au film serves as the top electrode.
FIG. 5E shows deposition of multilayer magnetic FeGaB/$AlO_x$ on the AlN thin film followed by etching of the Si substrate to release the layered structure made of the Pt thin film overlaid with the AlN thin film, the Au thin film, and the FeGaB/$AlO_x$ multilayers.
Figure 6:
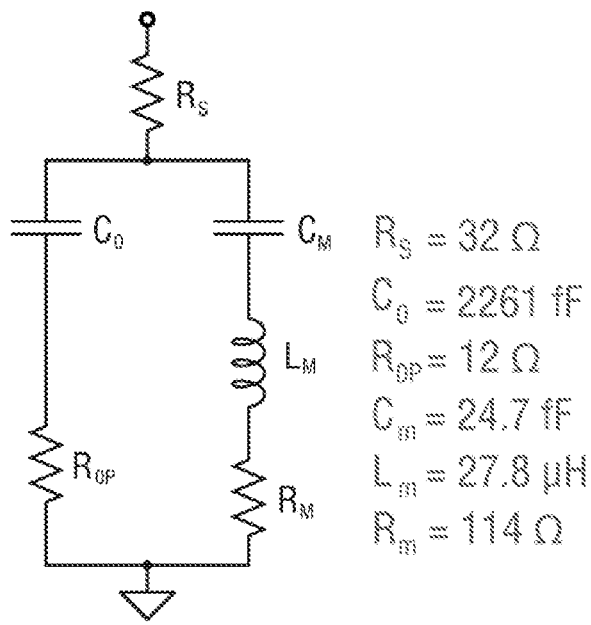
FIG. 6 shows an equivalent BVD model circuit and fitting parameters of the ME NPR shown in FIG. 1A.

The NPR and FBAR devices share the same fabrication process shown in FIGS. 5A-5E. To begin with, a 50 nm thick Platinum (Pt) film (502) was sputter-deposited and patterned by lift-off on high resistivity (>10000 ohm cm) silicon (Si) (501) serving as a substrate, thereby generating the bottom electrode of the device (FIG. 5A). Next, a 500 nm AlN film (503) was sputter-deposited and vias etched (using H$_3$PO$_4$) to access the bottom electrodes (FIG. 5B). The AlN film was further etched by chlorine-based inductively coupled plasma (ICP) (FIG. 5C). Next, a 100 nm thick gold (Au) film (504) was evaporated and patterned by lift-off to form the top ground (FIG. 5D). A 500 nm thick FeGaB/AlO$_x$ multilayer film (505) was deposited next by magnetron sputtering and patterned by lift-off (FIG. 5E). Of note, during the magnetic deposition, a 100 Oe in-situ magnetic field bias was applied along the anchor direction (i.e., parallel to the FeGaB/AlO$_x$ multilayer film) of the device to pre-orient the magnetic domains. Finally, the Si substrate was etched by XeF$_2$ isotropic etching thereby releasing the layered structure composed of the Pt, Aln, FeGaB/AlO$_x$ multilayer, and gold films.

Example 3. Equivalent Circuit Modeling of NPR Antenna.

As shown in FIG. 1C, the admittance amplitude of NPR can be fitted with Butterworth-van Dyke (BVD) model to extract the electromechanical parameters such as electromechanical coupling coefficient $k_t^2$ and quality factor Q. A BVD equivalent circuit consists of electrical components and equivalent mechanical components connected in parallel. The electrical and the mechanical components constitute the electrical and the mechanical branch, respectively. As shown in FIG. 6, the electrical branch includes device capacitance $C_0$, defined by the device geometry, and resistance $R_{0p}$ associated with dielectric loss. The mechanical branch contains motional capacitance $C_m$, motional inductance $L_m$, and motional resistance $R_m$. These components can be expressed as $$R_m = \frac{1}{\omega_0 C_0 k_t^2 Q}, C_m = \frac{8}{\pi^2} C_0 k_t^2, \text{ and } L_m = \frac{1}{\omega_0^2 C_m}.$$

Series resistance $R_s$ is connected in serial to both branches as electrical loss of the electrodes. Resonance frequency occurs at $2\pi\omega_0$, where the $C_m$ and $L_m$ cancel each other. $k_t^2$ represents the efficiency of electrical and acoustic energy conversion and Q defines the ratio of the energy stored in the vibrating resonant structure to the energy dissipated per cycle by the damping processes. Note that the $k_t^2 Q$ is the figure of merit (FOM) of an electromechanical resonator.

Example 4. Simulation of RF Coil

The RF magnetic field used in the operation of the ME NPR devices described herein is generated by a RF coil with an inner diameter of 7.7 mm and 7 turns. The RF coil was soldered on the SMA port and connected to the out-put port of the lock-in amplifier. The magnetic flux density generated by the RF coil was simulated by Finite Element Method (FEM) software, Comsol Multiphysics V5.1. The input for the simulation was RF voltage with a peak-amplitude of 1V. FIG. 7 shows the magnetic flux density as a function of the center axis coordinate (x). The left end of the coil was placed at x=0 mm and the NPR devices under test was placed at x=14 mm. In this configuration, the magnetic flux density applied to the devices under test was 60 nT.

Example 5. Simulation of a Small Loop Antenna

Small loop antennas have overall circumference that is less than about one-tenth of a wavelength (C<λ/10). They have small radiation resistance which is usually smaller than their loss resistance. Low radiation resistance and high reactance make it difficult to match impedance. Small loop antennas are most often used as receiving antennas for magnetic field sensing or magnetic radiators where loss due to impedance mismatch can be tolerated. The ANSYS HFSS 15 software was used to simulate the performance of a small loop antenna. This small loop antenna has the same dimension as the ME FBAR antenna, including the ground loop, with a=550 μm, where a is the radius of the smallest imaginary sphere of enclosing the entire antenna structure. The small loop antenna was designed as a chip-scale device and is compatible with a lithographic fabrication process. The substrate is AlN with 2.2 μm thickness. The conductor is copper with 5 μm thickness.

Example 6: Magnetoelectric Coupling and Frequency Analysis

To analyze the response of the ME structures, coupling between the magnetic, elastic, and electric field in the magnetostrictive and piezoelectric elements were taken into consideration. Simulations using the FEM software Comsol Multiphysics V5.1 were carried out to investigate the frequency response analysis using existing modules, namely, magnetic fields, solid mechanics, and electrostatics modules. The ME structures were divided into a magnetostrictive phase, a piezoelectric phase, and an air subdomain. Simulation was performed with frequency domain in 3D geometry in order to illustrate the modeling principles for more complicated problems.

In air phase, it was assumed that a spatially uniform, sinusoidally time varying, background magnetic field applied using the magnetic fields, reduced field formulation. The air model space was truncated by an infinite element domain region. This is a domain condition that approximates a domain that extends into infinity. When using the infinite element domain feature, the boundary conditions on the outside of the modeling does not affect the solutions obtained from the simulation. In the magnetostrictive FeGaB, however, magnetic permeability and magnetostrictive strain become-nonlinearly dependent on the magnetic flux and the mechanical stress and strains in the ME composite. As such, constitutive equations of magnetoretrictivity were solved using experimentally measured nonlinear magentostriction and magnetic field. The B vs. H relationship can be separated into two parts, namely (i) a non-magnetic phase, such as piezoelectric and air, with B=u0*ur*H, and (ii) a magnetostrictive phase, with B=f(H) and an interpolation function based on experimental results. With regard to FeGaB, which was assembled in the solid mechanics module, a number of the material parameters such as young's module, poisson's ratios, and densities were taken into consideration.

For the piezoelectric AlN it was assumed that a small signal at simulation point may be described by the linear piezo material model, for which established constitutive relations exist in a strain-charge form. Similarly, piezoelectric tensors and mechanical properties were required for the PZD modules, which is a built in conditions. The relation between the stress, electric field, and electric displacement field, in a stress-charge form, is given by the piezoelectric constitutive equations, $$\sigma = c\varepsilon - eE$$

$$D = c\varepsilon + kE$$

where σ and ε are the stress and strain tensors, respectively; E and D are electric filed and electric flux density, respectively. c, e and k are stiffness, strain to electric field coupling constant, and permittivity, respectively. The PZD module combines the solid mechanics (solid) and electrostatics (es) for modeling the piezo devices. The solid mechanics model is described by the well-known elastic constitutive relations, $$\varepsilon = \frac{1}{2}[(\nabla_u)^T + \nabla_u]$$

$$\sigma = C\varepsilon$$

and $$\nabla \sigma = -\rho \omega^2$$

where u is the displacement, ρ is the density, ω is the angle frequency, and C is the elasticity matrix.

The electrostatics model for modeling a piezoelectric phase in Comsol Multiphysics provides the following equations, $$\nabla D = \rho_v$$

$$E = -\nabla \varphi$$

where $\rho_v$ is the electric charge density, and φ is the electric potential.

In the simulation, parameters of the AlN from Comsol Multiphysics material library (see below) were used. For simplification, the magnetostrictive phase was treated under a linear elastic model which is a part of PZD module. In this model, the magnetostrictive layer is described with the same equations as piezoelectric material. Various parameters for linear material are listed below.

Linear materials parameters:
AlN:
Relative Permeability is 1
Density: 3300 kg cm$^{-3}$
Electrical Conductivity: $10^{-6}$ S m$^{-1}$
Dielectric loss factor is 0.002
Mechanical damping loss factor is 0.001
Elasticity in matrix:

$$\begin{pmatrix} 41 & 14.9 & 9.9 & 0 & 0 & 0 \\ 14.9 & 41 & 9.9 & 0 & 0 & 0 \\ 9.9 & 99 & 38.9 & 0 & 0 & 0 \\ 0 & 0 & 0 & 12.5 & 0 & 0 \\ 0 & 0 & 0 & 0 & 12.5 & 0 \\ 0 & 0 & 0 & 0 & 0 & 12.5 \end{pmatrix} 10^{10} Pa$$

Piezoelectric charge coupling constants in matrix:

$$\begin{pmatrix} 0 & 0 & 0 & 0 & -0.48 & 0 \\ 0 & 0 & 0 & -4.8 & 0 & 0 \\ -0.58 & -0.58 & 1.55 & 0 & 0 & 0 \end{pmatrix} C/m^2$$

Relative permittivity in matrix:

$$\begin{pmatrix} 9.2 & 0 & 0 \\ 0 & 9.2 & 0 \\ 0 & 0 & 10.3 \end{pmatrix}$$

FeGaB:
Density is 7860 kg cm$^{-3}$
Poisson's ratio is 0.27.
Relative permittivity is 1.
Relative permeability is 1300.
Electrical Conductivity is 200000 S m$^{-1}$.
Young's Modulus is 55 GPa.
Magnetostriction is 70 ppm.
Saturation is 1114084 A m$^{-1}$.

REFERENCES

1. Godara, L. C. Application of antenna arrays to mobile communications, part II: Beam-forming and direction-of-arrival considerations. Proc. IEEE 85, 1195-1245 (1997).
2. Stutzman, W. L. & Thiele, G. A. Antenna theory and design. (John Wiley & Sons, 2012).
3. Kramer, B. A., Chen, C.-C., Lee, M. & Volakis, J. L. Fundamental limits and design guidelines for miniaturizing ultra-wideband antennas. Antennas Propag. Mag. IEEE 51, 57-69 (2009).
4. Bibes, M. Towards a magnetoelectric memory. Nature 7, 425-426 (2008).
5. Brataas, A., Kent, A. D. & Ohno, H. Current-induced torques in magnetic materials. Nat. Mater. 11, 372-381 (2012).
6. Hu, J.-M., Li, Z., Chen, L.-Q. & Nan, C.-W. High-density magnetoresistive random access memory operating at ultralow voltage at room temperature. Nat. Commun. 2, 553 (2011).
7. Dong, S., Zhai, J., Xing, Z., Li, J. F. & Viehland, D. Extremely low frequency response of magnetoelectric multilayer composites. Appl. Phys. Lett. 86, 1-3 (2005).
8. Lage, E. et al. Exchange biasing of magnetoelectric composites. Nat. Mater. 11, 523-529 (2012).
9. Nan, T., Hui, Y., Rinaldi, M. & Sun, N. X. Self-Biased 215MHz Magnetoelectric NEMS Resonator for Ultra-Sensitive DC Magnetic Field Detection. Sci. Rep. 3, 1985 (2013).
10. Hui, Y. et al. High Resolution Magnetometer Based on a High Frequency Magnetoelectric MEMS-CMOS Oscillator. Microelectromechanical Syst. J. 24, 134-143 (2014).
11. Srinivasan, G. & Fetisov, Y. K. Ferrite-Piezoelectric Layered Structures: Microwave Magnetoelectric Effects and Electric Field Tunable Devices. Ferroelectrics 342, 65-71 (2006).
12. Fetisov, Y. K. & Srinivasan, G. Electric field tuning characteristics of a ferrite-piezoelectric microwave resonator. Appl. Phys. Lett. 88, 9-12 (2006).
13. Das, J., Song, Y. Y., Mo, N., Krivosik, P. & Patton, C. E. Electric-field-tunable low loss multiferroic ferrimagnetic-ferroelectric heterostructures. Adv. Mater. 21, 2045-2049 (2009).
14. Sun, N. X. & Srinivasan, G. Voltage Control of Magnetism in Multiferroic Heterostructures and Devices. Spin 2, 1240004 (2012).
15. Hui, Y., Gomez-Diaz, J. S., Qian, Z., Alù, A. & Rinaldi, M. Plasmonic piezoelectric nanomechanical resonator for spectrally selective infrared sensing. Nat. Commun. 7, 11249 (2016).
16. Qian, Z., Liu, F., Hui, Y., Kar, S. & Rinaldi, M. Graphene as a Massless Electrode for Ultrahigh-Frequency Piezoelectric Nanoelectromechanical Systems. Nano Lett. 150605140657009 (2015). doi:10.1021/acs.nanolett.5b01208
17. Dong, S., Zhai, J., Bai, F., Li, J. F. & Viehland, D. Push-pull mode magnetostrictive/piezoelectric laminate composite with an enhanced magnetoelectric voltage coefficient. Appl. Phys. Lett. 87, 1-4 (2005).
18. Nan, C. W. Magnetoelectric effect in composites of piezoelectric and piezomagnetic phases. Phys. Rev. B 50, 6082-6088 (1994).
19. Lou, J. et al. Soft magnetism, magnetostriction, and microwave properties of FeGaB thin films. Appl. Phys. Lett. 91, 18-20 (2007).
20. Lou, J., Liu, M., Reed, D., Ren, Y. & Sun, N. X. Giant electric field tuning of magnetism in novel multiferroic FeGaB/Lead zinc niobate-lead titanate (PZN-PT) heterostructures. Adv. Mater. 21, 4711-4715 (2009).
21. Piazza, G. and Stephanou, P. J. and Pisano, A. P. Piezoelectric Aluminum Nitride Vibrating Contour-mode MEMS resonator. Microelectromechanical Syst. J. 15, 1406-1418 (2006).
22. Rinaldi, M., Zuniga, C., Zuo, C. & Piazza, G. Super-High-Frequency Two-Port AlN Contour-Mode Resonators for RF Applications Super-High-Frequency Two-Port AlN Applications. IEEE Trans. Ultrason. Ferroelectr. Freq. Control 57, 38-45 (2010).
23. Zuniga, C., Rinaldi, M., Khamis, S. M., Johnson, a. T. & Piazza, G. Nanoenabled microelectromechanical sensor for volatile organic chemical detection. Appl. Phys. Lett. 94, (2009).

24. Srinivasan, G. et al. Resonant magnetoelectric coupling in trilayers of ferromagnetic alloys and piezoelectric lead zirconate titanate: The influence of bias magnetic field. Phys. Rev. B-Condens. Matter Mater. Phys. 71, 1-6 (2005).

25. Greve, H. et al. Low damping resonant magnetoelectric sensors. Appl. Phys. Lett. 97, 1-3 (2010).

26. Greve, H., Woltermann, E., Quenzer, H.-J., Wagner, B. & Quandt, E. Giant magnetoelectric coefficients in (Fe90Co10)78Si12B10-AlN thin film composites. Appl. Phys. Lett. 96, 182501 (2010).

27. Jahns, R. et al. Giant magnetoelectric effect in thin-film composites. J. Am. Ceram. Soc. 96, 1673-1681 (2013).

28. Fiebig, M. Revival of the magnetoelectric effect. J. Phys. D. Appl. Phys. 38, R123-R152 (2005).

29. Nan, C. W., Bichurin, M. I., Dong, S., Viehland, D. & Srinivasan, G. Multiferroic magnetoelectric composites: Historical perspective, status, and future directions. J. Appl. Phys. 103, 1-35 (2008).

30. Lou, J., Pellegrini, G. N., Liu, M., Mathur, N. D. & Sun, N. X. Equivalence of direct and converse magnetoelectric coefficients in strain-coupled two-phase systems. Appl. Phys. Lett. 100, 1-3 (2012).

31. Clow, H. Very Low Coercive Force in Nickel--iron Films. (1962).

32. Marauska, S. et al. MEMS magnetic field sensor based on magnetoelectric composites. J. Micromechanics Microengineering 22, 065024 (2012).

33. Israel, C., Mathur, N. D. & Scott, J. F. A one-cent room-temperature magnetoelectric sensor. Nat. Mater. 7, 93-94 (2008).

34. Wu, J., Yang, X., Lou, J., Beguhn, S. & Sun, N. X. Non-reciprocal tunable low-loss bandpass filters with ultra-wideband isolation based on magnetostatic surface wave. Microw. Theory Tech. IEEE Trans. 60, 3959-3968 (2012).

35. Lin, H. et al. Integrated non-reciprocal dual H-and E-Field tunable bandpass filter with ultra-wideband isolation. in Microw. Symp. (IMS), 2015 IEEE MTT-S Int. 1-4 (2015).

36. Chui, S. T. & Hu, L. Theoretical investigation on the possibility of preparing left-handed materials in metallic magnetic granular composites. Phys. Rev. B 65,144407 (2002).

37. Kummer, W. H. & Gillespie, E. S. Antenna measurements-1978. in IEEE Proc. 66,483-507 (1978).

38. Chu, L. J. Physical Limitations of Omni-Directional Antennas. J. Appl. Phys. 19,1163-1175 (1948).

39. Karnaushenko, D. D., Karnaushenko, D., Makarov, D. & Schmidt, O. G. Compact helical antenna for smart implant applications. NPG Asia Mater. 7, e188 (2015).

40. C. Niamien, S. Collardey, A. Sharaiha, and K. Mandjoubi, "Ultraminiature UHF antenna using magneto-dielectric material," Electron. Lett., vol. 47, no. 5, pp. 300-301, Mar. 2011.

41. H. Liu, K. L. Ford, and R. J. Langley, "Miniature platform tolerant antenna composed of microstrip line and AMC surface," Electron. Lett., vol. 46, no. 22, pp. 1480-1481, Oct. 2010.

42. H. M. Chen, Y. K. Wang, Y. F. Lin, C. Y. Lin, and S. C. Pan, "Microstripfed circularly polarized square-ring patch antenna for GPS applications," IEEE Trans. Antennas Propag., vol.

57, no. 4, pp. 1264-1267, Apr. 2009.

44. M. Hosseini, D. M. Klymyshyn, G. Wells, and X. Liu "Short and Open Circuited EBG Resonator Antennas: Miniaturization With a Shorting Plate and Dielectric Loading," IEEE Trans. Antennas Propag., vol. 63, no. 1, pp. 4305, Oct. 2015.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

From the above description, one skilled in the art can easily ascertain the essential characteristics of the present invention, and without departing from the spirit and scope thereof, can make various changes and modifications of the invention to adapt it to various usages and conditions. Thus, other embodiments are also within the scope of the following claims.

What is claimed is:

1. A nanomechanical magnetoelectric (NME) antenna comprising:
a thin film heterostructure having a magnetic element and a piezoelectric element,
wherein the heterostructure is (i) suspended on a substrate, and (ii) capable of resonating at acoustic resonance frequencies;
wherein in a transmission mode, oscillating mechanical strain produced by voltage induced acoustic waves is transferred to the heterostructure through strain mediated magnetoelectric coupling, leading to magnetization oscillation that radiates electromagnetic waves at the acoustic resonance frequencies; and wherein in a receiving mode, the heterostructure senses magnetic components of electromagnetic waves arriving at the antenna, converting the magnetic components into a piezoelectric voltage output,
wherein the heterostructure is suspended on the substrate by clamping, and
wherein at least a portion of the suspended heterostructure is spaced apart from the substrate for vibrating freely to allow optimal coupling between magnetic, elastic, and electric fields encountered by the heterostructure.

2. The NME antenna of claim 1, wherein the mode of vibration excited in the piezoelectric layer by the magnetic field and the electric field are the same.

3. The NME antenna of claim 1, wherein the substrate is a high resistivity silica wafer.

4. The NME antenna of claim 1, wherein the magnetic element comprises a FeGaB/AlO$_x$ multilayer made of alternating layers of an alloy of Fe, Ga, and B (FeGaB) and AlO$_x$.

5. The NME antenna of claim 1, wherein the piezoelectric layer comprises at least one piezoelectric material selected from the group consisting of: aluminum nitride, lithium niobate, lithium tantalate, zinc oxide, gallium nitride, and quartz.

6. The NME antenna of claim 5, wherein the piezoelectric element is a thin film made of aluminum nitride (AlN).

7. The NME antenna of claim 6, wherein the thickness of the AlN thin film is from about 350 nm to about 650 nm.

8. The NME antenna of claim 4, wherein the thickness of the FeGaB/AlO$_x$ multilayer is from about 350 to about 650 nm.

9. The NME antenna of claim 1, wherein the frequency of the radiated electromagnetic waves ranges from 10 MHz to 10 GHz.

10. The NME antenna of claim 1, wherein the thin film heterostructure is rectangular.

11. The NME antenna of claim 10, wherein the heterostructure exhibits an in-plane contour mode of vibration ($d_{31}$ mode).

12. The antenna of claim 10, wherein the length and the width of the thin film heterostructure range from 100 μm to 400 μm and from 25 μm to 100 μm, respectively.

13. The NME antenna of claim 10, wherein ME coupling constant of 4 kV Oe$^{-1}$ cm$^{-1}$ to 8 kV Oe$^{-1}$ cm$^{-1}$ is obtained in the absence of a DC bias magnetic field.

14. The antenna of claim 1, wherein the thin film heterostructure is circular.

15. The antenna of claim 14, wherein the thin film heterostructure has a diameter ranging from about 100 μm to about 400 μm.

16. A nanomechanical magnetoelectric (NME) antenna array comprising:
- a plurality of thin film heterostructures suspended on a substrate, wherein, each of said plurality of heterostructures (i) includes a magnetic element and a piezoelectric element, (ii) is rectangular or circular in shape; and (iii) is capable of resonating at acoustic resonance frequencies;
- wherein in a transmission mode, oscillating mechanical strain produced by voltage induced acoustic waves is transferred to each of said plurality of heterostructures through strain mediated magnetoelectric coupling, leading to magnetization oscillation (or magnetic current) that radiate electromagnetic waves at the acoustic resonance frequencies ranging from 10 MHz and 10 GHz; and in a receiving mode, each of said plurality of heterostructures senses magnetic components of electromagnetic waves arriving at the antenna, converting the magnetic components into a piezoelectric voltage output,
- wherein each of the heterostructures is suspended on the substrate by clamping, and
- wherein at least a portion of each suspended heterostructure is spaced apart from the substrate for vibrating freely to allow optimal coupling between magnetic, elastic, and electric fields encountered by the heterostructure.

17. A method of fabricating a nanomechanical magnetoelectric antenna device, the method comprising:
(a) providing a high resistivity substrate and depositing a film of a first electrode material on the substrate, partially covering the substrate;
(b) depositing a film of piezoelectric material covering the first electrode material and the substrate;
(c) etching a first via in the piezoelectric material thereby exposing the substrate, wherein the via is located at one extremity of the first electrode material film;
(d) etching a second via in the piezoelectric material film at a location of the substrate not covered by the first electrode material film;
(e) depositing a film of gold on the piezoelectric material film and patterning to form a top ground;
(f) depositing a film of magnetic material on the piezoelectric material film, the dimension of the magnetic material film being about the same as that of the first electrode material film; and
(ii) etching the substrate,
wherein, the first electrode material film and the films of piezoelectric material, magnetic material and gold layered on top of it form a heterostructure, wherein at least a portion of the heterostructure is released from the substrate for vibrating freely to allow optimal coupling between magnetic, elastic, and electric fields encountered by the heterostructure while being supported by the substrate through clamping.

18. The method of claim 17, wherein the etching in step (c) is performed using H3PO4 or a chlorine-based inductively coupled plasma (ICP).

19. The method of claim 17, wherein an in-situ magnetic field bias is applied while depositing the magnetic material (step (e)) along an anchor direction of the device to pre-orient magnetic domains present in the magnetic material.

20. The method of claim 17, wherein the strength of the in-situ magnetic field is from about 75 Oe to about 150 Oe.

21. The method of claim 17, wherein the substrate is etched using XeF$_2$ isotropic etching.

22. A device comprising an NME antenna according to claim 1.

23. A device comprising a nanomechanical magnetoelectric (NME) antenna array according to claim 16.

* * * * *